US012695439B2

(12) United States Patent (10) Patent No.: US 12,695,439 B2
Iwamoto et al. (45) Date of Patent: ***Jul. 28, 2026

(54) ACOUSTIC WAVE FILTER DEVICE

(71) Applicant: Murata Manufacturing Co., Ltd.,
Nagaokakyo (JP)

(72) Inventors: Takashi Iwamoto, Nagaokakyo (JP);
Motoji Tsuda, Nagaokakyo (JP);
Hiroshi Somada, Nagaokakyo (JP);
Eiji Fujimori, Nagaokakyo (JP);
Masaki Kasai, Nagaokakyo (JP);
Takuma Kuroyanagi, Nagaokakyo
(JP); Shinichiro Takayanagi,
Nagaokakyo (JP)

(73) Assignee: **MURATA MANUFACTURING CO.,
LTD.**, Kyoto (JP)

( * ) Notice: Subject to any disclaimer, the term of this
patent is extended or adjusted under 35
U.S.C. 154(b) by 90 days.

This patent is subject to a terminal dis-
claimer.

(21) Appl. No.: 18/766,887

(22) Filed: Jul. 9, 2024

(65) Prior Publication Data

US 2024/0364307 A1     Oct. 31, 2024

Related U.S. Application Data

(63) Continuation     of     application     No.
PCT/JP2023/003059, filed on Jan. 31, 2023.

(30) Foreign Application Priority Data

Feb. 22, 2022     (JP) ................................. 2022-025773

(51) Int. Cl.
*H03H 9/54*          (2006.01)
*H03H 9/13*          (2006.01)
(Continued)

(52) U.S. Cl.
CPC .............. *H03H 9/54* (2013.01); *H03H 9/133*
(2013.01); *H03H 9/176* (2013.01); *H03H 9/72*
(2013.01)

(58) Field of Classification Search
CPC ........... H03H 9/54; H03H 9/133; H03H 9/176
(Continued)

(56) References Cited

U.S. PATENT DOCUMENTS

2009/0224851 A1     9/2009  Feiertag et al.
2017/0346463 A1     11/2017  Hatakeyama et al.
(Continued)

FOREIGN PATENT DOCUMENTS

JP          2005210295 A     8/2005
JP          2008546207 A     12/2008
(Continued)

OTHER PUBLICATIONS

International Search Report in PCT/JP2023/003059, mailed Apr. 25,
2023, 3 pages.
(Continued)

*Primary Examiner* — Andrea Lindgren Baltzell
*Assistant Examiner* — Abigail Amir Yaldo
(74) *Attorney, Agent, or Firm* — Keating & Bennett, LLP

(57)          ABSTRACT

A duplexer includes a piezoelectric substrate including an
upper surface and a lower surface, a functional element on
the lower surface, a flat plate electrode on a side of the upper
surface of the piezoelectric substrate, and a dielectric portion
that is located between the functional element and the flat
plate electrode and has a permittivity lower than a permit-
tivity of the piezoelectric substrate.

19 Claims, 7 Drawing Sheets

(51) Int. Cl.
  *H03H 9/17*        (2006.01)
  *H03H 9/72*        (2006.01)
(58) Field of Classification Search
  USPC .................................................. 333/186, 193
  See application file for complete search history.

(56)                    References Cited

U.S. PATENT DOCUMENTS

| | | |
|---|---|---|
| 2020/0106416 A1 | 4/2020 | Iwamoto |
| 2020/0321933 A1 | 10/2020 | Kishimoto et al. |
| 2020/0403596 A1 | 12/2020 | Yamaguchi et al. |
| 2021/0006274 A1 | 1/2021 | Kani |
| 2021/0399716 A1 * | 12/2021 | Yu ........................ H03H 9/0514 |

FOREIGN PATENT DOCUMENTS

| | | |
|---|---|---|
| JP | 2017212628 A | 11/2017 |
| WO | 2018235433 A1 | 12/2018 |
| WO | 2019124126 A1 | 6/2019 |
| WO | 2019187773 A1 | 10/2019 |
| WO | 2019188875 A1 | 10/2019 |

OTHER PUBLICATIONS

Written Opinion in PCT/JP2023/003059, mailed Apr. 25, 2023, 4 pages.

* cited by examiner

FIG.5

FIG.9            10B
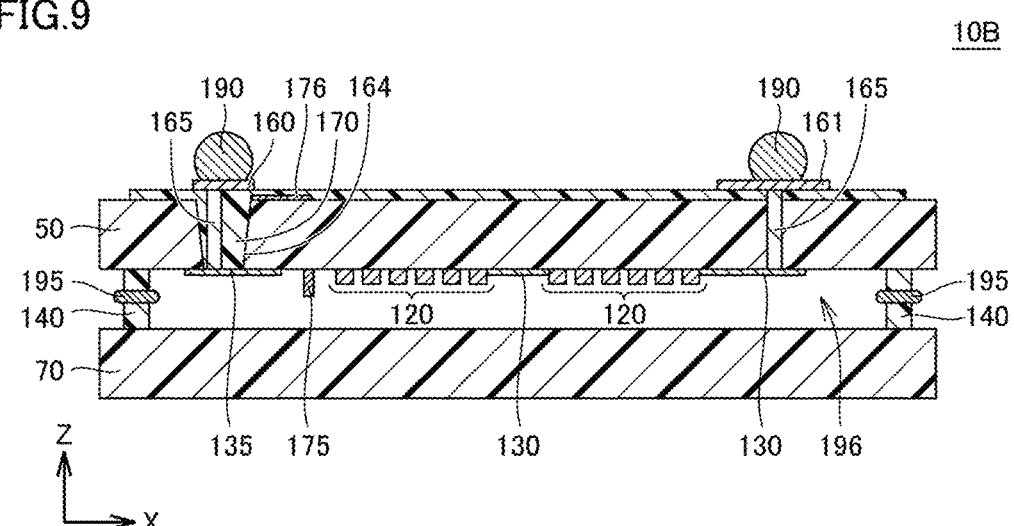

ACOUSTIC WAVE FILTER DEVICE

CROSS REFERENCE TO RELATED APPLICATIONS

This application claims the benefit of priority to Japanese Patent Application No. 2022-025773 filed on Feb. 22, 2022 and is a Continuation Application of PCT Application No. PCT/JP2023/003059 filed on Jan. 31, 2023. The entire contents of each application are hereby incorporated herein by reference.

BACKGROUND OF THE INVENTION

1. Field of the Invention

The present disclosure relates to acoustic wave filter devices, and more specifically, to techniques to reduce or prevent a decrease in filter characteristics of acoustic wave filter devices.

2. Description of the Related Art

Japanese Unexamined Patent Application Publication No. 2008-546207 discloses a filter device having a configuration in which element structures (a first functional element and a second functional element) disposed at two substrates, respectively, are opposed to each other with a space interposed therebetween. Here, a signal path to be coupled to the first functional element is coupled to an external terminal while penetrating through the substrate at which the second functional element is disposed.

According to the above-described configuration disclosed in Japanese Unexamined Patent Application Publication No. 2008-546207, a distance between the second functional element and an electrode for the first functional element provided to the substrate at which the second functional element is disposed is reduced, such that an unnecessary parasitic capacitance may be generated therebetween. If an impact of this parasitic capacitance grows larger, there is a concern of a decrease in filter characteristics due to an increase in loss associated with impedance mismatching and/or deterioration of isolation attributed to interference between the functional elements.

SUMMARY OF THE INVENTION

Example embodiments of the present invention provide acoustic wave filters in each of which a decrease in filter characteristics is reduced or prevented.

An acoustic wave filter device according to an example embodiment of the present invention includes a first piezoelectric substrate including a first principal surface and a second principal surface, a first functional element on the first principal surface, a first electrode on a second principal surface side, and a dielectric portion. The dielectric portion is located between the first functional element and the first electrode and has a permittivity lower than a permittivity of the first piezoelectric substrate.

With acoustic wave filter devices according to example embodiments of the present invention, the dielectric portion having the lower permittivity than that of the piezoelectric substrate is located between the first functional element located on the first principal surface side of the first piezoelectric substrate and the first electrode disposed on the second principal surface side of the first piezoelectric substrate and used to couple to an external device. Thus, a permittivity between the first electrode and the first functional element becomes smaller than a permittivity in a case where the dielectric portion is not provided, so that a parasitic capacitance to be generated between the first electrode and the first functional element can be reduced. Accordingly, an adverse effect on filter characteristics associated with the parasitic capacitance is reduced so that a decrease in filter characteristics of the acoustic wave filter device can be reduced or prevented.

The above and other elements, features, steps, characteristics and advantages of the present invention will become more apparent from the following detailed description of the example embodiments with reference to the attached drawings.

BRIEF DESCRIPTION OF THE DRAWINGS

FIG. 5 is a diagram for explaining a manufacturing process of the acoustic wave filter device of FIG. 2.

FIG. 9 is a sectional view of an acoustic wave filter device according to Example Embodiment 3 of the present invention.

DETAILED DESCRIPTION OF THE EXAMPLE EMBODIMENTS

Figure 1:
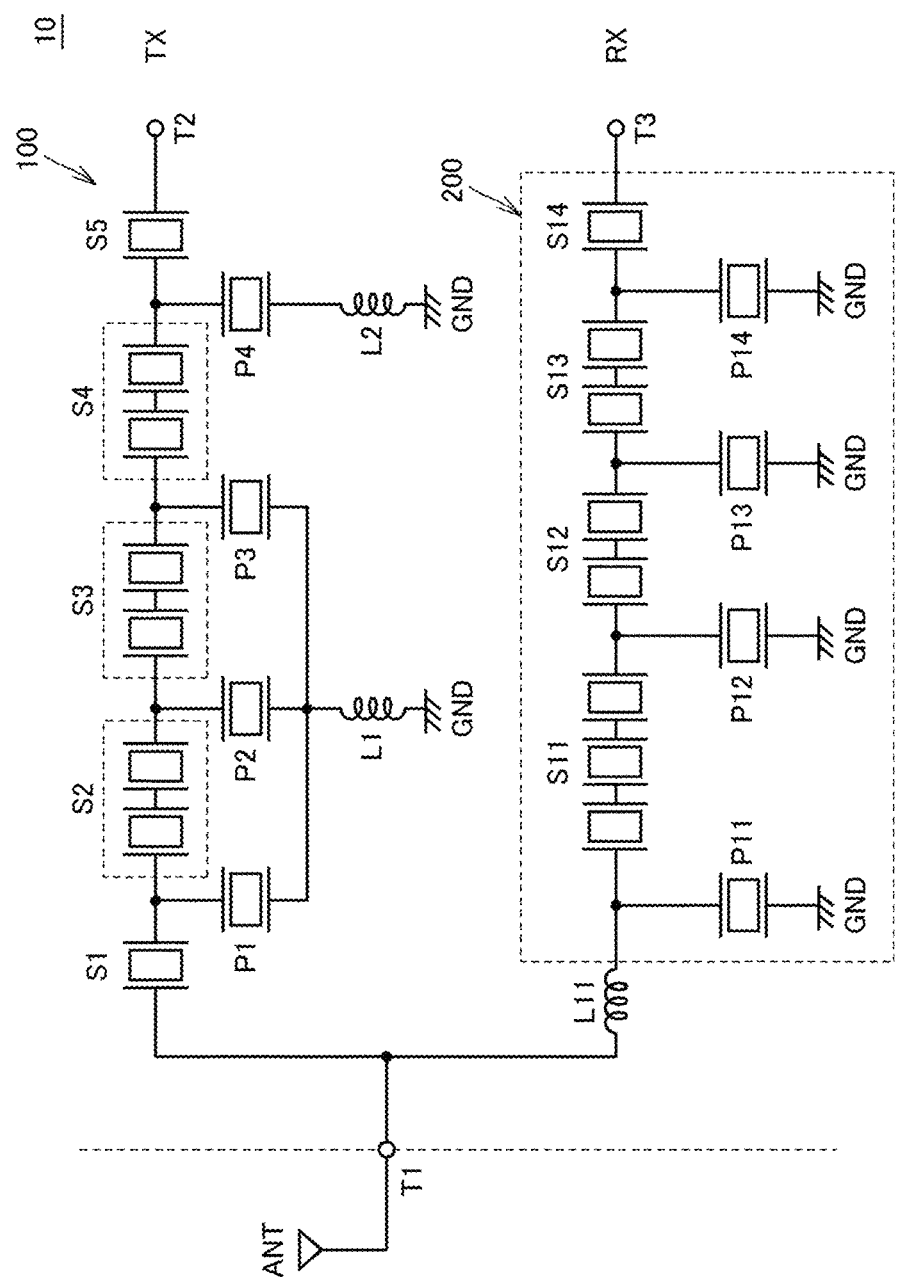
FIG. 1 is a diagram illustrating an example of a circuit configuration of an acoustic wave filter device according to Example Embodiment 1 of the present invention.

Example embodiments of the present invention will be described below in detail with reference to the drawings. The same or equivalent portions in the drawings will be denoted by the same reference signs and explanations thereof will not be repeated.

Example Embodiment 1

Configuration of Duplexer

FIG. 1 is a diagram illustrating a circuit configuration of a duplexer 10 that represents an example of an acoustic wave filter device according to Example Embodiment 1 of the present invention. The duplexer 10 is a filter used in a transmission reception circuit of a communication apparatus, for example.

With reference to FIG. 1, the duplexer 10 includes an antenna terminal T1, and a transmission (TX) filter 100 as well as a reception (RX) filter 200 electrically coupled to an antenna ANT by using the antenna terminal T1. The example of the duplexer 10 illustrated in FIG. 1 represents a duplexer defined by two filters.

The filter 100 is, for example, a ladder filter coupled between the antenna terminal T1 and a transmission terminal T2, which filters a signal received with the transmission terminal T2 and outputs the signal from the antenna ANT. The filter 100 is enables a signal in a first pass band to pass therethrough.

The transmission filter 100 includes a serial arm circuit including serial arm resonance units S1 to S5 that are serially coupled between the antenna terminal T1 and the transmission terminal T2, and a parallel arm circuit including parallel arm resonance units P1 to P4 that are coupled between the serial arm circuit and a ground potential GND. Each resonance unit of the serial arm resonance units S1 to S5 and the parallel arm resonance units P1 to P4 includes at least one acoustic wave resonator. According to the description of the example of FIG. 1, for example, each resonator of the serial arm resonance units S1 and S5 and the parallel arm resonance units P1 to P4 includes one acoustic wave resonator while each resonator of the serial arm resonance units S2 to S4 includes two acoustic wave resonators. However, the number of the acoustic wave resonators included in each resonance unit is not limited thereto and the number may be appropriately selected in conformity to filter characteristics. For the acoustic wave resonator, for example, it is possible to use a surface acoustic wave (SAW) resonator, a bulk acoustic wave (BAW) resonator, and the like. Here, for example, a film bulk acoustic resonator (FBAR) and/or a solid mounted resonator (SMR) can be used as the BAW resonator.

One end of the parallel arm resonance unit P1 is coupled to a connecting point between the serial arm resonance unit S1 and the serial arm resonance unit S2, and another end thereof is coupled to the ground potential GND with an inductor L1 interposed therebetween. One end of the parallel arm resonance unit P2 is coupled to a connecting point between the serial arm resonance unit S2 and the serial arm resonance unit S3, and another end thereof is coupled to the ground potential GND with the inductor L1 interposed therebetween as with the parallel arm resonance unit P1. One end of the parallel arm resonance unit P3 is coupled to a connecting point between the serial arm resonance unit S3 and the serial arm resonance unit S4, and another end thereof is coupled to the ground potential GND with the inductor L1 interposed therebetween as with the parallel arm resonance units P1 and P2. One end of the parallel arm resonance unit P4 is coupled to a connecting point between the serial arm resonance unit S4 and the serial arm resonance unit S5, and another end thereof is coupled to the ground potential GND with an inductor L2 interposed therebetween.

The reception filter 200 is, for example, a ladder filter coupled between the antenna terminal T1 and a reception terminal T3, which filters a signal received with the antenna ANT and outputs the signal from the reception terminal T3. The filter 200 enables a signal in a second pass band to pass therethrough. The pass band of the filter 200 is different from the pass band of the filter 100. The filter 200 is coupled to the antenna terminal T1 with an impedance matching inductor L11 interposed therebetween.

The filter 200 includes a serial arm circuit including serial arm resonance units S11 to S14 that are serially coupled between the inductor L11 and the reception terminal T3, and a parallel arm circuit including parallel arm resonance units P11 to P14 that are coupled between the serial arm circuit and the ground potential GND. Each resonance unit of the serial arm resonance units S11 to S14 and the parallel arm resonance units P11 to P14 includes at least one acoustic wave resonator. In the filter 200 as well, the number of the acoustic wave resonators included in each resonance unit is not limited to the case in FIG. 1 and the number is appropriately selected in conformity to the filter characteristics as with the filter 100. Moreover, for the acoustic wave resonator used therein, it is possible to use, for example, a SAW resonator, a BAW resonator, and the like.

One end of the parallel arm resonance unit P11 is coupled to a connecting point between the inductor L11 and the serial arm resonance unit S11, and another end thereof is coupled to the ground potential GND. One end of the parallel arm resonance unit P12 is coupled to a connecting point between the serial arm resonance unit S11 and the serial arm resonance unit S12, and another end thereof is coupled to the ground potential GND. One end of the parallel arm resonance unit P13 is coupled to a connecting point between the serial arm resonance unit S12 and the serial arm resonance unit S13, and another end thereof is coupled to the ground potential GND. One end of the parallel arm resonance unit P14 is coupled to a connecting point between the serial arm resonance unit S13 and the serial arm resonance unit S14, and another end thereof is coupled to the ground potential GND.

Here, the filter 100 corresponds to a "first filter" and the filter 200 corresponds to a "second filter".

Figure 2:
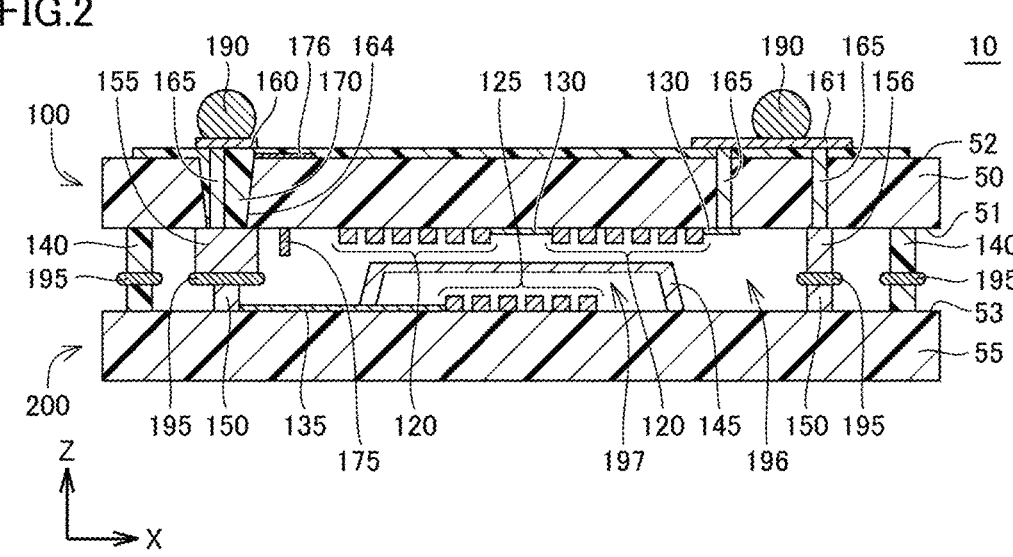
FIG. 2 is a sectional view of the acoustic wave filter device according to Example Embodiment 1 of the present invention.

FIG. 2 is a sectional view of the duplexer 10 of FIG. 1. Meanwhile, FIG. 3 is a partial sectional view in the vicinity of an outer electrode in the duplexer 10 of FIG. 2.

Figure 3:
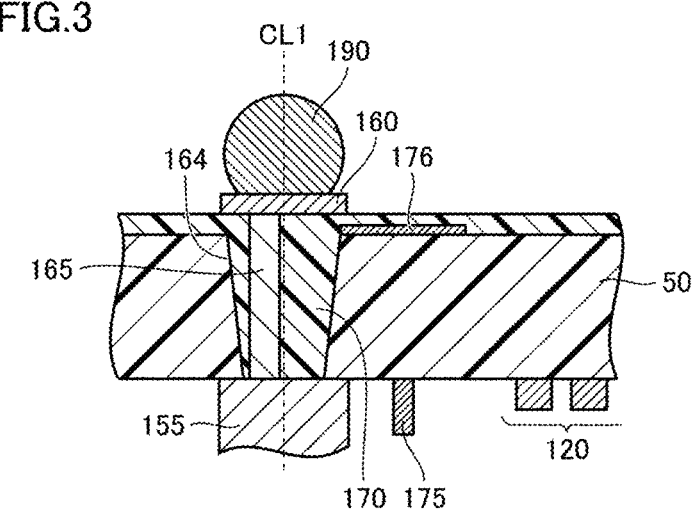
FIG. 3 is a partial sectional view in the vicinity of an outer electrode in the acoustic wave filter device of FIG. 2.

With reference to FIGS. 2 and 3, the duplexer 10 has a configuration in which the filter 100 is stacked on the filter 200 in FIG. 1. Here, in the drawings from FIG. 2 on, a direction to stack the filters 100 and 200 will be defined as z-axis direction while in-plane directions of substrates of the respective filters will be defined as x-axis direction and y-axis direction. Meanwhile, a positive direction of the z-axis direction may be referred to as upward and a negative direction thereof may be referred to as downward in some cases.

The duplexer 10 includes a piezoelectric substrate 50 and functional elements 120 which define the filter 100, and a piezoelectric substrate 55 and a functional element 125 which define the filter 200. Meanwhile, the duplexer 10 includes a support layer 140, columnar electrodes 150, 155, and 156, flat plate electrodes 160 and 161, coupling electrodes 165, a dielectric portion 170, and solder bumps 190.

The piezoelectric substrates 50 and 55 are made of a piezoelectric single crystal material such as lithium tantalate ($LiTaO_3$), lithium niobate ($LiNbO_3$), zinc oxide (ZnO), aluminum nitride, and lead zirconate titanate (PZT), or from a piezoelectric laminated material of those materials, for example.

The functional element 120 is disposed at a lower surface 51 of the piezoelectric substrate 50 and the functional element 125 is disposed at an upper surface 53 of the piezoelectric substrate 55. Here, FIG. 2 describes an example in which two functional elements 120 are disposed at the piezoelectric substrate 50 and one functional element 125 is disposed at the piezoelectric substrate 55. However, the number of the functional elements is not limited thereto. One functional element 120 may be provided or three or more functional elements 120 may be provided at the piezoelectric substrate 50. Meanwhile, for example, two or more functional elements 125 may be provided at the piezoelectric substrate 55.

The functional elements 120 and 125 include acoustic wave resonators including comb-shaped IDT (interdigital transducer) electrodes. A SAW resonator includes the piezoelectric substrate and the functional elements. The functional elements 120 and 125 can be made, for example, using a single-component metal including at least one of aluminum (Al), copper (Cu), silver (Ag), gold (Au), titanium (Ti), tungsten (W), platinum (Pt), chromium (Cr), nickel (Ni), and molybdenum (Mo), or a metal material such as an alloy including these metals as major ingredients. Meanwhile, for example, the functional elements 120 and 125 may have a structure formed by laminating multiple metallic films formed from these metals or alloys.

The piezoelectric substrate 50 is supported at a position spaced away from the piezoelectric substrate 55 by using the support layer 140. The support layer 140 surrounds the functional elements 120 and 125 on the piezoelectric substrates 50 and 55. For example, the support layer 140 is made of a resin including an organic material such as polyimide, epoxy type resin, cyclic olefin type resin, benzocyclobutene, polybenzoxazole, phenol type resin, silicone, and acrylic resin. A hollow space 196 is provided between the piezoelectric substrate 50 and the piezoelectric substrate 55 by using the support layer 140 and the piezoelectric substrates 50 and 55.

In this hollow space 196, the functional elements 120 at the piezoelectric substrate 50 and the functional element 125 at the piezoelectric substrate 55 are disposed so as to be at least partially opposed to each other. Here, in order to prevent coupling between the functional elements 120 and 125 opposed to each other, a shield electrode may be disposed between the functional elements 120 and the functional element 125. In FIG. 2, a shield electrode 145 is disposed on the piezoelectric substrate 55 so as to cover the functional element 125, and the functional element 125 is disposed in a hollow space 197 defined by the shield electrode 145. Another shield electrode to be disposed so as to cover the functional elements 120 may be disposed on the piezoelectric substrate 50, instead of or in addition to the shield electrode 145.

Meanwhile, the columnar electrodes 150, 155, and 156 defining a portion of a signal path between the functional element 125 and an external device (not illustrated) are disposed in the hollow space 196. The columnar electrodes 150, 155, and 156 are made of a conductive material such as, for example, copper, silver, gold, platinum, aluminum, nickel, or an alloy of these materials.

The columnar electrode 150 is disposed at the upper surface 53 of the piezoelectric substrate 55 and is coupled to the functional element 125 by using a wiring electrode 135. The columnar electrode 150 is coupled to the columnar electrode 155 or the columnar electrode 156 disposed at the lower surface 51 of the piezoelectric substrate 50 by using a coupling member 195 such as solder.

The columnar electrodes 155 and 156 disposed at the piezoelectric substrate 50 are coupled to the flat plate electrodes 160 and 161 disposed on an upper surface 52 side of the piezoelectric substrate 50, respectively, with the coupling electrodes 165 to penetrate the piezoelectric substrate 50 interposed therebetween. In FIG. 2, the coupling electrodes 165 are via electrodes that extend in the z-axis direction. The flat plate electrodes 160 and 161 are outer terminal electrodes to be coupled to the external device, which are mounted on the external device or an external substrate by using the coupling members such as, for example, the solder bumps 190. Here, in the example of FIG. 2, a path of the flat plate electrode 160 is a signal line while a path of the flat plate electrode 161 is a ground line.

The functional elements 120 on the piezoelectric substrate 50 are coupled between the functional elements and to the flat plate electrode 161 by using wiring electrodes 130. Although not illustrated in FIG. 2, the signal line of the functional element 120 is coupled to another flat plate electrode disposed on the upper surface 52 side of the piezoelectric substrate 50 with the coupling electrode 165 interposed therebetween.

In the duplexer 10 of the Example Embodiment 1, the dielectric portion 170 is disposed between the flat plate electrodes 160 and 161 and the upper surface 52 of the piezoelectric substrate 50. Meanwhile, the dielectric portion 170 is also disposed around the coupling electrode 165, which is disposed in a through hole 164 that penetrates the piezoelectric substrate 50 and defines and functions as a signal path of the functional element 125. The dielectric portion 170 is made of an insulating material having a lower permittivity than that of the piezoelectric substrate 50. The dielectric portion 170 is made of a resin including an organic material such as, for example, polyimide, epoxy resin, cyclic olefin resin, benzocyclobutene, polybenzoxazole, phenol type resin, silicone, cycloolefin, and acrylic resin, or from an inorganic substance such as a silicon oxide film. In one example, the permittivity of the piezoelectric substrate 50 is, for example, in a range from about 30 to about 45 in the case of being made of lithium tantalate (LT) or lithium niobate (LN), and the permittivity of the dielectric portion 170 is, for example, in a range from about 2 to about 5 in the case of being made of the aforementioned resin.

As described above, in the case of the configuration in which the flat plate electrode 160 for external coupling is disposed at the piezoelectric substrate 50 on the filter 100 side and the signal path to be coupled to the functional element 125 on the filter 200 side reaches the flat plate electrode 160 by way of the coupling electrode 165 that penetrates the piezoelectric substrate 50, there may be a case of a layout with a close distance between the signal path on the filter 200 side and the functional element 120 on the filter 100 side. Since the material of the piezoelectric substrate 50 has a relatively high permittivity as described above, a parasitic capacitance to be generated between the flat plate electrode 160 as well as the coupling electrode 165 that penetrates the substrate and the functional element 120 is prone to grow large. In this case, the impedance may vary due to the parasitic capacitance and deviate from designed characteristic impedance (such as, for example, about 50Ω), such that a return loss may possibly be increased by impedance mismatching.

Moreover, a signal may leak out to the other filter as a consequence of electromagnetic coupling between the signal path of the filter 200 and the functional element 120 of the filter 100, such that isolation characteristics between the functional elements, that is, between the filters may possibly be decreased.

In the duplexer 10 of the Example Embodiment 1, the dielectric portion 170 having the lower permittivity than the permittivity of the piezoelectric substrate 50 is disposed between the piezoelectric substrate 50 and the flat plate electrode 160 that defines and functions as the electrode for the outer terminal, as well as around the coupling electrode 165 that defines and functions as a signal line of the filter 200. Accordingly, it is possible to reduce the virtual permittivity between the signal path of the filter 200 and the functional element 120 of the filter 100 as compared to the case of not disposing the dielectric portion 170. This makes it possible to reduce the parasitic capacitance that may occur between the coupling electrode 165 as well as the flat plate electrode 160 and the functional element 120, so that the increase in return loss and the decrease in isolation characteristics can be reduced or prevented as a consequence.

Here, in the duplexer 10 of the Example Embodiment 1, as illustrated in FIG. 3, the coupling electrode 165 to be coupled to the flat plate electrode 160 is disposed in a direction to move away from the functional element 120 relative to the center (a phantom line CL1 in FIG. 3) of the through hole 164, or in other words, at a position spaced away in the negative direction of the x axis. By disposing the coupling electrode 165 at the above-described position in the through hole 164, it is possible to secure the distance between the coupling electrode 165 and the functional element 120 as long as possible, and to increase an amount of the dielectric portion 170 having the low permittivity to be disposed between the coupling electrode 165 and the functional element 120. Accordingly, it is possible to further reduce the parasitic capacitance to be generated between the coupling electrode 165 and the functional element 120.

Meanwhile, as illustrated in FIGS. 2 and 3, a shield electrode 176 in a flat plate shape to be coupled to the ground potential may further be disposed at a position at the upper surface 52 of the piezoelectric substrate 50 intersecting with the shortest path that links the flat plate electrode 160 to the functional element 120. Coupling between the flat plate electrode 160 and the functional element 120 is reduced or prevented by disposing the above-described shield electrode 176, so that the parasitic capacitance between the flat plate electrode 160 and the functional element 120 can further be reduced.

In addition, a shield electrode 175 to be coupled to the ground potential may further be disposed at the lower surface 51 of the piezoelectric substrate 50 between the columnar electrode 155 and the functional element 120. The shield electrode 175 may have a configuration to dispose a conductor having a flat plate shape in a wall structure or a configuration to juxtapose multiple columnar electrodes. Coupling between the columnar electrode 155 and the functional element 120 is reduced or prevented by disposing the above-mentioned shield electrode 175, so that the parasitic capacitance between the signal path of the functional element 125 and the functional element 120 can further be reduced.

Another Example of Coupling Electrode

The above-described duplexer 10 has a configuration in which the coupling electrode 165 to be disposed in the through hole 164 is provided as a via hole that extends in the z-axis direction. However, the member to couples the flat plate electrode 160 to the columnar electrode 155 does not always have to be provided into the via hole.

Figure 4:
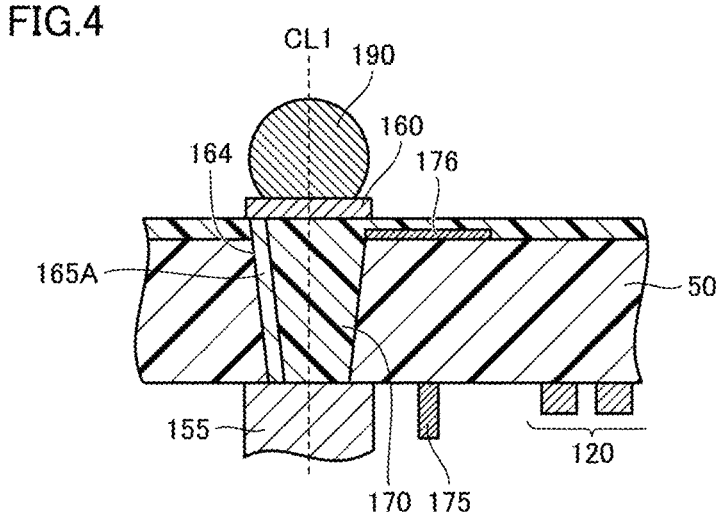
FIG. 4 is a diagram illustrating another layout example of a coupling electrode in a through hole.

FIG. 4 is a diagram illustrating another example of the coupling electrode to be disposed in the through hole 164. A coupling electrode 165A in the example of FIG. 4 is an electrode disposed along a portion of an inner peripheral surface of the through hole 164 on a far side from the functional element 120. Regarding the coupling electrode 165A, a dielectric pattern in which a portion on the far side from the functional element 120 is open is formed by applying and putting the dielectric portion 170 having photosensitivity into the through hole 164 after formation of the through hole 164 in a manufacturing process to be described later with reference to FIG. 5, and then carrying out exposure and development. Thereafter, the coupling electrode 165A is formed at an opening of the dielectric portion 170 in accordance with a plating method and the like.

In the case of the coupling electrode 165A, it is possible to provide the longer distance from the functional element 120 as compared to the coupling electrode 165 having the via-hole configuration illustrated in FIG. 3. Thus, the parasitic capacitance to be generated between the coupling electrode 165A and the functional element 120 can further be reduced.

Manufacturing Process

An example of a manufacturing process of the duplexer 10 according to the Example Embodiment 1 will be described with reference to FIG. 5. In step (a), laminated structure bodies defining the filters 100 and 200 are fabricated by forming the functional elements 120 and 125 to excite acoustic waves on the surfaces of the piezoelectric substrates 50 and 55, respectively. The electrodes to define and function as the functional elements 120 and 125 are formed in accordance with a film forming method such as, for example, sputtering and vapor deposition, or a wiring forming method such as photolithography.

In step (b), a resin layer 141 for forming the support layer 140, the columnar electrodes 155 and 156, the wiring electrodes 130, and the shield electrode 175 are formed on the piezoelectric substrate 50. Meanwhile, a resin layer 142 for forming the support layer 140, the columnar electrodes 150, and the wiring electrode 135 are formed on the piezoelectric substrate 55 as well.

In step (c), the shield electrode 145 is formed on the piezoelectric substrate 55 of the filter 200 so as to cover the functional element 125. Thus, the hollow space 197 is formed around the functional element 125.

In step (d), the two laminated structure bodies are stacked on each other such that the functional elements 120 of the filter 100 are opposed to the functional element 125 of the filter 200, and the resin layers and the columnar electrodes are coupled by using the coupling member 195. According to this step, the hollow space 196 is formed around the functional elements 120 by using the piezoelectric substrates 50 and 55 and the support layer 140.

In step (e), the through hole 164 that penetrates the piezoelectric substrate 50 is formed at a position of the piezoelectric substrate 50 corresponding to the columnar electrode 155. Meanwhile, through holes 163 that penetrate the piezoelectric substrate 50 are formed at positions corresponding to the columnar electrode 156 and the wiring electrode 130. For example, the through holes are formed by a laser, sandblast, dry etching, or the like.

In step (f), the dielectric portion 170 having the lower permittivity than that of the piezoelectric substrate 50 is disposed inside the through hole 164 and at the upper surface 52 of the piezoelectric substrate 50. Here, in the case of disposing the shield electrode 176, the dielectric portion 170 is disposed after the shield electrode 176 is disposed at the upper surface 52 of the piezoelectric substrate 50. Moreover, in the step (f), the dielectric portion 170 in the through hole 164 is provided with a through hole 162 for forming the coupling member to be coupled to the columnar electrode 155.

Meanwhile, in the case of using a photosensitive resin as the dielectric portion 170, the photosensitive resin is applied to the upper surface 52 of the piezoelectric substrate 50 and into the through hole 164, and an opening is formed at a portion to dispose a conductive portion and the like by partially removing the photosensitive resin in accordance with the photolithography. The method of forming the opening may be other methods. For example, the opening may be formed by applying a non-photosensitive material to the portion to provide the opening, and the opening may be formed by using a laser or by dry etching. Alternatively, for example, an inorganic film such as silicon oxide ($SiO_2$) may be formed at the portion to provide the opening, and then the opening may be formed by dry etching.

Thereafter, in step (g), the coupling electrodes 165 are formed by putting a conductive member into the through holes 162 and 163. In the meantime, the flat plate electrodes 160 and 161 are formed on the dielectric portion 170 so as to be electrically coupled to the coupling electrodes 165.

Then, in step (h), the solder bumps 190 to be coupled to the external device are formed on the flat plate electrodes 160 and 161. The duplexer 10 is formed in accordance with the above-described steps.

Figure 5:
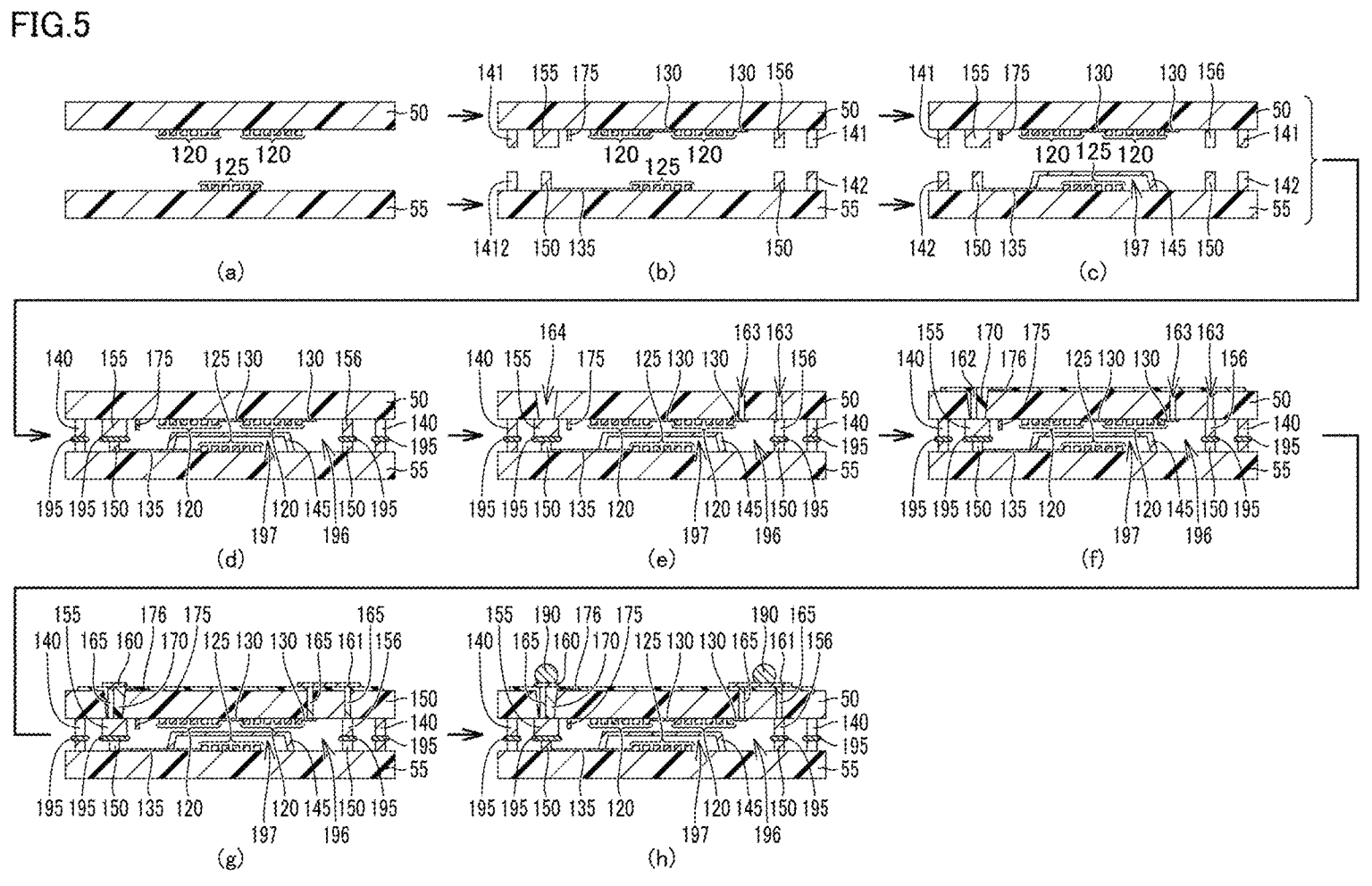

Although FIG. 5 has described a manufacturing process of one duplexer in order to facilitate the explanations, elements for multiple duplexers are simultaneously formed on one piezoelectric substrate in an actual manufacturing scene for mass production. Then, individual duplexers are finished by dividing the elements into pieces by using a dicing machine and the like after the step (h).

Here, the "piezoelectric substrate 50" and the "piezoelectric substrate 55" in the Example Embodiment 1 correspond to a "first piezoelectric substrate" and a "second piezoelectric substrate", respectively. The "lower surface 51" and the "upper surface 52" of the piezoelectric substrate 50 in the Example Embodiment 1 correspond to a "first principal surface" and a "second principal surface", respectively. The "upper surface 53" of the piezoelectric substrate 55 in the Example Embodiment 1 corresponds to a "third principal surface". The "flat plate electrode 160" in the Example Embodiment 1 corresponds to a "first electrode". The "functional element 120" and the "functional element 125" in the Example Embodiment 1 correspond to a "first functional element" and a "second functional element", respectively.

Example Embodiment 2

The Example Embodiment 1 has described the case of the configuration in which the piezoelectric substrate includes a single layer structure of a material such as, for example, lithium tantalate (LT) and lithium niobate (LN). Example Embodiment 2 of the present invention will describe a case of a configuration in which the piezoelectric substrates include a multilayer structure including two or more materials.

Figure 6:
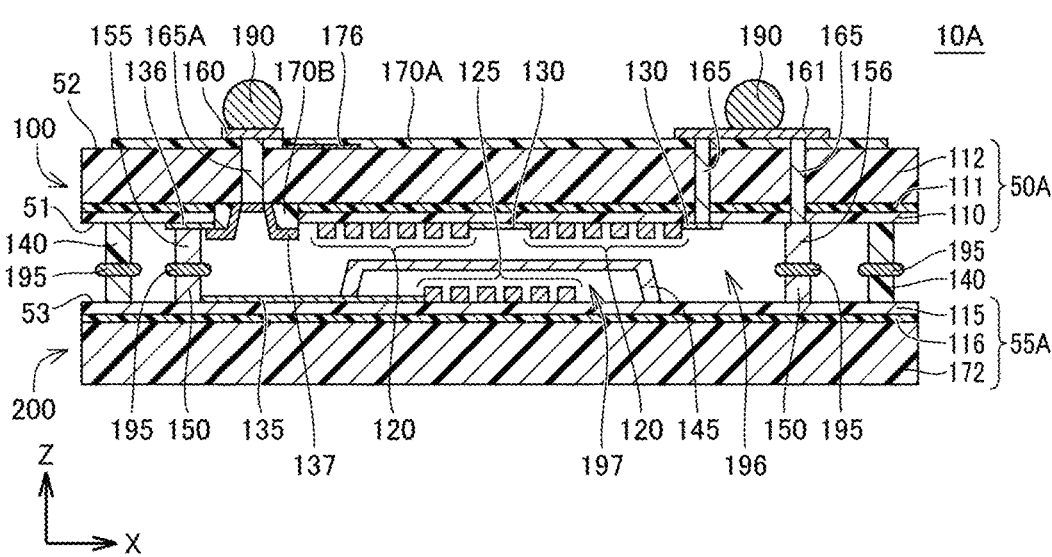
FIG. 6 is a sectional view of an acoustic wave filter device according to Example Embodiment 2 of the present invention.
Figure 7:
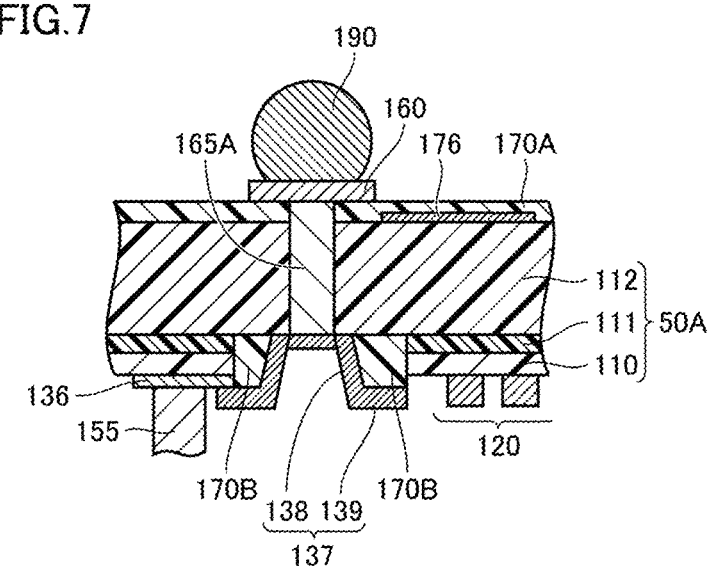
FIG. 7 is a partial sectional view in the vicinity of an outer electrode in the acoustic wave filter device of FIG. 6.

FIG. 6 is a sectional view of a duplexer 10A that represents an example of an acoustic wave filter device according to the Example Embodiment 2. Meanwhile, FIG. 7 is a partial sectional view in the vicinity of an outer electrode in the duplexer 10 of FIG. 6. As compared to the duplexer 10 of the Example Embodiment 1, the piezoelectric substrates 50 and 55 are replaced by piezoelectric substrates 50A and 55A in the duplexer 10A and a structure in the vicinity of the outer electrode in the signal path of the filter 200 is different. Explanations of the elements of the duplexer 10A overlapping those of the duplexer 10 of the Example Embodiment 1 will not be repeated.

With reference to FIG. 6, each of the piezoelectric substrates 50A and 55A in the duplexer 10A includes a support substrate, a piezoelectric layer, and an insulating layer disposed between the support substrate and the piezoelectric layer. To be more precise, the piezoelectric substrate 50A includes a support substrate 112, a piezoelectric layer 110, and an insulating layer 111 disposed between the support substrate 112 and the piezoelectric layer 110. Meanwhile, the piezoelectric substrate 55A includes a support substrate 117, a piezoelectric layer 115, and an insulating layer 116 disposed between the support substrate 117 and the piezoelectric layer 115.

The support substrates 112 and 117 are formed by using silicon, for example. The piezoelectric layers 110 and 115 are formed from a piezoelectric single crystal material such as, for example, lithium tantalate (LT), lithium niobate (LN), zinc oxide, aluminum nitride, and lead zirconate titanate, or from a piezoelectric laminated material of those materials as with the piezoelectric substrates 50 and 55 in the Example Embodiment 1. The insulating layers 111 and 116 are formed by using a silicon oxide (SiO$_2$), silicon nitride (SiN), or a multilayer body thereof, for example. Here, the insulating layers 111 and 116 are not always included, and a configuration in which the piezoelectric substrate includes the support substrate and the piezoelectric layer is also acceptable.

As with the duplexer 10 of the Example Embodiment 1, the functional elements 120 and 125 are disposed on the piezoelectric layers 110 and 115, respectively, and the SAW resonator is thus provided.

As illustrated in FIG. 7, the signal path to the functional element 125 in the filter 100 includes a coupling electrode 165A that penetrates the piezoelectric substrate 50A, and electrodes 136 and 137 to couple the coupling electrode 165A to the columnar electrode 155. The coupling electrode 165A is coupled to the flat plate electrode 160 on the upper surface 52 side of the piezoelectric substrate 50A. The flat plate electrode 160 is disposed on a dielectric portion 170A that is disposed at the upper surface 52 of the piezoelectric substrate 50A. Meanwhile, another end portion of the coupling electrode 165A is coupled to the electrode 137 at the lower surface 51 of the piezoelectric substrate 50A.

The electrode 137 has a hat shape or an approximate hat shape including a recess in the negative direction of the z axis, and includes a wall portion 138 inclined in the z-axis direction and a peripheral portion 139 bulging outward from the wall portion 138. The peripheral portion 139 is coupled to the columnar electrode 155 with the electrode 136 disposed on the piezoelectric layer 110 interposed therebetween.

In the piezoelectric substrate 50A, the piezoelectric layer 110 and the insulating layer 111 at a portion to dispose the electrode 137 are removed, and a dielectric portion 170B is disposed at the portion where these layers are removed. The dielectric portion 170B is in contact with the piezoelectric layer 110 and the insulating layer 111. Here, the electrode 137 is in contact with the piezoelectric layer 110 with the dielectric portion 170B interposed therebetween.

The dielectric portion 170A on the upper surface 52 side of the piezoelectric substrate 50A and the dielectric portion 170B on the lower surface 51 side thereof are made of a material having a lower permittivity than those of the piezoelectric layer 110, the insulating layer 111, and the support substrate 112 of the piezoelectric substrate 50A. In one example, the permittivity of the piezoelectric layer 110 is equal to about 50, the permittivity of the insulating layer 111 is equal to about 4, and the permittivity of the support substrate 112 is equal to about 10. On the other hand, for example, the permittivity of the dielectric portions 170A and 170B is equal to or below about 3.

Here, in the piezoelectric substrate 50A, the coupling electrode 165A that penetrates the piezoelectric substrate 50A is in contact with the support substrate 112 having the lower permittivity than that of the piezoelectric layer 110. Accordingly, it is not configured to further provide the dielectric portion having the low permittivity around the coupling electrode 165 as in the Example Embodiment 1. On the other hand, regarding the electrode 137 located close to the piezoelectric layer 110 and the functional element 120, the dielectric portion 170B having the lower permittivity than that of the piezoelectric layer 110 is provided between the piezoelectric layer 110 and the electrode 137. According to the above-described configuration, the parasitic capacitance to be generated between the signal path of the functional element 125 and the functional element 120 can be reduced. Thus, it is possible to reduce or prevent an increase in return loss and a decrease in isolation characteristics.

Manufacturing Process

Figure 8:
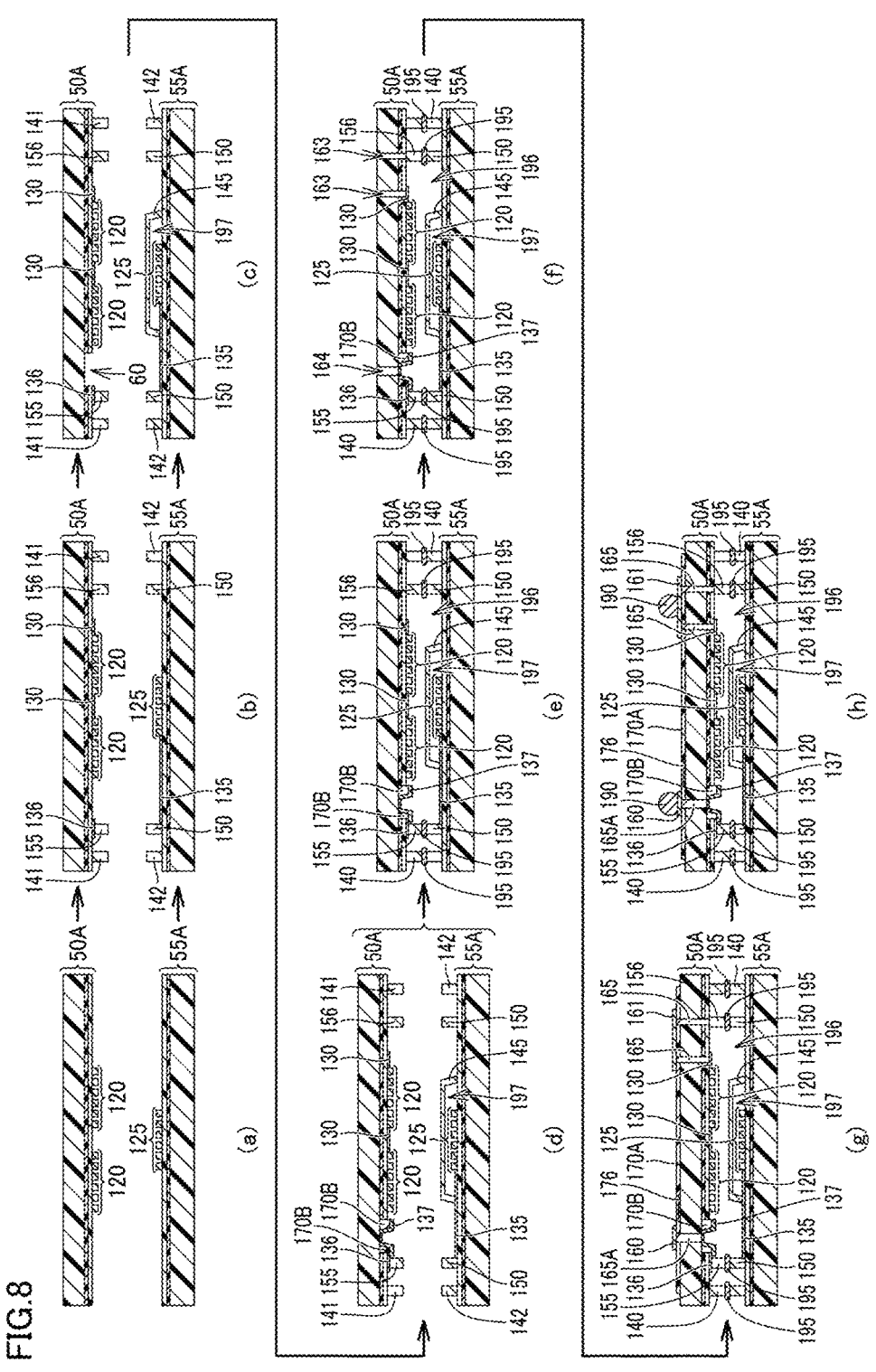
FIG. 8 is a diagram for explaining a manufacturing process of the acoustic wave filter device of FIG. 6.

Next, an example of a manufacturing process of the duplexer 10A according to the Example Embodiment 2 will be described with reference to FIG. 8. First, in step (a), the piezoelectric substrates 50A and 55A are formed by laminating the insulating layers and the piezoelectric layers on the support substrates. Thereafter, laminated structure bodies are fabricated by forming the functional elements 120 and 125 on the piezoelectric layers 110 and 115, respectively.

In step (b), the resin layer 141 for forming the support layer 140, the columnar electrodes 155 and 156, and the wiring electrodes 130 are formed on the piezoelectric substrate 50A. Meanwhile, the resin layer 142 for forming the support layer 140, the columnar electrodes 150, and the wiring electrode 135 are formed on the piezoelectric substrate 55A as well.

In step (c), the piezoelectric layer 110 and the insulating layer 111 at the portion of the piezoelectric substrate 50A to form the signal path of the functional element 125 are removed to form an opening 60. Moreover, the shield electrode 145 is formed on the piezoelectric substrate 55A of the filter 200 so as to cover the functional element 125. Thus, the hollow space 197 is formed around the functional element 125.

In step (d), the dielectric portion 170B having the lower permittivity than that of the piezoelectric layer 110 is disposed at the portion of the opening 60 formed in the step (c), which is in contact with the piezoelectric layer 110. Moreover, the electrode 137 to be coupled to the columnar electrode 155 is formed. In this instance, the electrode 137 is disposed to come into contact with the piezoelectric layer 110 with the dielectric portion 170B interposed therebetween.

In step (e), the two laminated structure bodies are stacked on each other such that the functional elements 120 of the filter 100 are opposed to the functional element 125 of the filter 200, and the resin layers and the columnar electrodes are coupled by using the coupling member 195. According to this step, the hollow space 196 is formed around the functional elements 120 by using the piezoelectric substrates 50A and 55A and the support layer 140.

In step (f), the through hole 164 that penetrates the piezoelectric substrate 50A is formed at a position of the piezoelectric substrate 50A corresponding to the electrode 137. Meanwhile, the through holes 163 that penetrate the piezoelectric substrate 50A are formed at the positions corresponding to the columnar electrode 156 and the wiring electrode 130.

In step (g), the dielectric portion 170A having the lower permittivity than that of the piezoelectric layer 110 is formed at the upper surface 52 of the piezoelectric substrate 50A. In the meantime, the coupling electrodes 165 and 165A are formed by filling the inside of the through holes 163 and 164 with the conductive member. Meanwhile, the flat plate electrodes 160 and 161 are formed on the dielectric portion 170A so as to be electrically coupled to the coupling electrodes 165A and 165, respectively. Here, in the case of disposing the shield electrode 176, the dielectric portion 170A is disposed after the shield electrode 176 is disposed at the upper surface 52 of the piezoelectric substrate 50A.

Then, in step (h), the solder bumps 190 to be coupled to the external device are formed on the flat plate electrodes 160 and 161. The duplexer 10A is formed in accordance with the above-described steps.

Here, the "piezoelectric substrate 50A" and the "piezoelectric substrate 55A" in the Example Embodiment 2 correspond to the "first piezoelectric substrate" and the "second piezoelectric substrate", respectively. The "electrode 137" in the Example Embodiment 2 corresponds to a "second electrode".

Example Embodiment 3

The Example Embodiments 1 and 2 have described configurations in which the two filters are provided at the different piezoelectric substrates, and the substrates have a stacked structure.

Example Embodiment 3 of the present invention will describe a case of a configuration in which functional elements corresponding to two filters are disposed on a common piezoelectric substrate. In this configuration as well, when a signal path of one of the functional elements is disposed close to the other functional element, the parasitic capacitance between the signal path and the functional element may decrease the filter characteristics as with the explanation in conjunction with the Example Embodiment 1. Accordingly, in the case of the above-described configuration, it is also possible to reduce the parasitic capacitance between the signal paths of the two filters and to reduce or prevent a decrease in filter characteristics by providing the configurations similar to those of the Example Embodiments 1 and 2.

FIG. 9 is a sectional view of a duplexer 10B that represents an example of an acoustic wave filter device according to the Example Embodiment 3. With reference to FIG. 9, the duplexer 10B roughly has a configuration in which the piezoelectric substrate 55 in the duplexer 10 of the Example Embodiment 1 is replaced by a cover portion 70 made of a resin. In the meantime, although not illustrated in FIG. 9, the functional element 125 defining the filter 200 is disposed at the piezoelectric substrate 50 in addition to the functional elements 120 defining the filter 100. For this reason, the columnar electrodes 150, 155, and 156 in the duplexer 10 do not include the duplexer 10B.

The cover portion 70 is supported by the support layer 140 at a position spaced away from the piezoelectric substrate 50. The hollow space 196 is defined by the piezoelectric substrate 50, the cover portion 70, and the support layer 140.

The functional elements 120 defining the filter 100 are coupled to the solder bumps 190 of the outer electrodes with the wiring electrode 130, the coupling electrode 165, and the flat plate electrode 161 interposed therebetween. Moreover, the functional elements 125 defining the filter 200 are coupled to the solder bumps 190 with the wiring electrode 135, the coupling electrode 165, and the flat plate electrode 160 interposed therebetween. Moreover, the dielectric portion 170 having the lower permittivity than that of the piezoelectric substrate 50 is disposed in the through hole 164 where the coupling electrode 165 for the functional element 125 is disposed, as well as between the flat plate electrode 160 and the piezoelectric substrate 50.

Here, in the duplexer 10B of FIG. 9, the coupling electrode 165 in the through hole 164 is disposed in a direction to move away from the functional element 120 relative to the center of the through hole 164. Moreover, the shield electrode 175 is disposed at the lower surface 51 of the piezoelectric substrate 50 and between the wiring electrode 135 and the functional element 120, and the shield electrode 176 is disposed at a position at the upper surface 52 of the piezoelectric substrate 50 intersecting with the shortest path that links the flat plate electrode 160 to the functional element 120.

As described above, even in the configuration to provide the functional elements corresponding to the two different filters disposed at the common piezoelectric substrate, the parasitic capacitance that may occur between the signal path of one of the filters and the functional element of the other filter can be reduced in the case where the signal path of the one filter is located close to the functional element of the other filter, by providing the dielectric portion having the lower permittivity than that of the piezoelectric substrate between the signal path and the other functional element. Accordingly, it is possible to reduce or prevent a decrease in filter characteristics attributed to the parasitic capacitance.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a first piezoelectric substrate including a first principal surface and a second principal surface;
a first functional element including at least one electrode provided on the first principal surface;
a first electrode provided on a second principal surface of the first piezoelectric substrate; and
a dielectric portion provided between the first functional element and the first electrode and having a permittivity lower than a permittivity of the first piezoelectric substrate; wherein
the first piezoelectric substrate includes:
a support substrate defining the second principal surface; and
a piezoelectric layer defining the first principal surface.

2. The acoustic wave filter device according to claim 1, further comprising:
a coupling electrode provided in a through hole penetrating the first piezoelectric substrate and electrically coupled to the first electrode; wherein
the dielectric portion extends around the coupling electrode in the through hole.

3. The acoustic wave filter device according to claim 2, wherein the coupling electrode is provided in the through hole at a position spaced away from the first functional element relative to a center of the through hole in a direction extending away from the through hole.

4. The acoustic wave filter device according to claim 1, further comprising:
a second electrode provided at the first principal surface and electrically coupled to the first electrode; wherein
the dielectric portion is provided on the first principal surface and between the first functional element and the second electrode.

5. The acoustic wave filter device according to claim 4, wherein each of the first and second electrodes includes comb-shaped interdigital transducer electrodes.

6. The acoustic wave filter device according to claim 1, wherein the dielectric portion is provided between the first electrode and the second principal surface.

7. The acoustic wave filter device according to claim 1, wherein the first piezoelectric substrate further includes an insulating layer provided between the support substrate and the piezoelectric layer.

8. The acoustic wave filter device according to claim 7, wherein
the support substrate is defined by a silicon substrate;
the piezoelectric layer includes lithium tantalate or lithium niobate; and
the insulating layer includes silicon oxide, silicon nitride, or a multilayer body including the silicon oxide and the silicon nitride.

9. The acoustic wave filter device according to claim 1, further comprising:
a second piezoelectric substrate opposed to the first principal surface; and
a second functional element provided on a third principal surface of the second piezoelectric substrate opposed to the first principal surface; wherein
the second functional element is electrically coupled to the first electrode.

10. The acoustic wave filter device according to claim 9, wherein
a first filter is defined by the first piezoelectric substrate and the first functional element;
a second filter is defined the second piezoelectric substrate and the second functional element; and
one of the first filter and the second filter is a transmission filter and another one of the first filter and the second filter is a reception filter.

11. The acoustic wave filter device according to claim 10, wherein each of the first filter and the second filter includes at least one of a surface acoustic wave filter or a bulk acoustic wave filter.

12. The acoustic wave filter device according to claim 9, further comprising a shield electrode provided between the first functional element and the second functional element and covering at least one of the first functional element and the second functional element.

13. The acoustic wave filter device according to claim 1, further comprising:
a second functional element provided on the first principal surface; wherein
the second functional element is electrically coupled to the first electrode.

14. The acoustic wave filter device according to claim 13, wherein
a first filter is defined by the first piezoelectric substrate and the first functional element;
a second filter is defined by the second piezoelectric substrate and the second functional element; and
one of the first filter and the second filter is a transmission filter and another one of the first filter and the second filter is a reception filter.

15. The acoustic wave filter device according to claim 13, wherein the second functional element includes comb-shaped interdigital transducer electrodes.

16. The acoustic wave filter device according to claim 13, wherein the second functional element includes at least one of aluminum, copper, silver, gold, titanium, tungsten, platinum, chromium, or molybdenum, or an alloy including aluminum, copper, silver, gold, titanium, tungsten, platinum, chromium, or molybdenum.

17. The acoustic wave filter device according to claim 1, wherein the first functional element includes at least one of aluminum, copper, silver, gold, titanium, tungsten, platinum, chromium, or molybdenum, or an alloy including aluminum, copper, silver, gold, titanium, tungsten, platinum, chromium, or molybdenum.

18. The acoustic wave filter device according to claim 1, wherein the permittivity of the first piezoelectric substrate is in a range of about 30 to about 45; and the permittivity of the dielectric portion is in a range of about 2 to about 5.

19. The acoustic wave filter device according to claim 1, wherein the dielectric portion includes polyimide, epoxy resin, cyclic olefin resin, benzocyclobutene, polybenzoxazole, phenol type resin, silicone, cycloolefin, and acrylic resin, or a silicon oxide film.

\* \* \* \* \*